(12) United States Patent  (10) Patent No.: US 9,400,224 B2
Chen et al.  (45) Date of Patent: Jul. 26, 2016

(54) PRESSURE SENSOR AND MANUFACTURING METHOD OF THE SAME (71) Applicant: Industrial Technology Research Institute, Hsinchu (TW)

(72) Inventors: Jien-Ming Chen, Tainan (TW);
Chin-Wen Huang, Zhubei (TW);
Chin-Hung Wang, Hsinchu (TW);
Jing-Yuan Lin, New Taipei (TW);
Yu-Sheng Hsieh, Zubei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/485,082

(22) Filed: Sep. 12, 2014

(65) Prior Publication Data

US 2016/0076959 A1 Mar. 17, 2016

(51) Int. Cl.
*G01L 9/00* (2006.01)
*H04R 19/00* (2006.01)
*H04R 31/00* (2006.01)
*H04R 1/28* (2006.01)

(52) U.S. Cl.
CPC ............ *G01L 9/0042* (2013.01); *H04R 19/005* (2013.01); *H04R 31/00* (2013.01); *H04R 1/28* (2013.01)

(58) Field of Classification Search
CPC ............... G01D 5/2417; B81B 3/0072; B81B 2201/0257; H04R 19/04; H04R 19/00; H04R 2201/003; H04R 31/003; H04R 2207/021; B06B 1/0292; Y10T 29/49117; H01P 1/127; G01L 9/0042
See application file for complete search history.

(56) References Cited

U.S. PATENT DOCUMENTS 6,535,460 B2  3/2003 Loeppert et al.
7,435,612 B2  10/2008 Xiao et al.
(Continued)

FOREIGN PATENT DOCUMENTS

CN  101346014  1/2009
TW  200625984  7/2006
(Continued)

OTHER PUBLICATIONS

Loeppert et al., "SiSonic tm—The First Commercialized MEMS Microphone", Solid-State Sensors, Actuators, and Microsystems Workshop, Jun. 4-8, 2006, pp. 27-30.
(Continued)

*Primary Examiner* — Yasser A Abdelaziez
(74) *Attorney, Agent, or Firm* — Muncy, Geissler, Olds & Lowe, P.C.

(57) ABSTRACT

A pressure sensor and a manufacturing method of the same are provided. The pressure sensor includes a substrate, a dielectric oxide layer, a first electrode, a dielectric connection layer, and a second electrode. The dielectric oxide layer is formed on the substrate. The first electrode is formed on the dielectric oxide layer. The dielectric connection layer is formed on the first electrode. The second electrode is formed on the dielectric connection layer. The second electrode comprises a patterned conductive layer and a dielectric layer. The patterned conductive layer has a plurality of holes, and the dielectric layer is formed on the patterned conductive layer and covers the inner walls of the plurality of holes. The first electrode, the dielectric connection layer, and the second electrode define a first chamber between the first electrode and the second electrode.

14 Claims, 7 Drawing Sheets

(56) References Cited

U.S. PATENT DOCUMENTS

| | | | |
|---|---|---|---|
| 7,435,663 B2 | 10/2008 | Tseng et al. | |
| 7,781,249 B2 | 8/2010 | Laming et al. | |
| 7,829,366 B2 | 11/2010 | Miller et al. | |
| 7,856,804 B2 | 12/2010 | Laming et al. | |
| 7,912,236 B2 | 3/2011 | Dehe et al. | |
| 8,173,471 B2 | 5/2012 | Hsieh et al. | |
| 8,525,389 B2* | 9/2013 | Tan | B81B 3/0072 257/254 |
| 2007/0201710 A1 | 8/2007 | Suzuki et al. | |
| 2007/0284682 A1 | 12/2007 | Laming et al. | |
| 2009/0041270 A1 | 2/2009 | Schrank et al. | |
| 2009/0047479 A1* | 2/2009 | Nakatani | H04R 19/005 428/157 |
| 2009/0278216 A1* | 11/2009 | Nakatani | H04R 31/006 257/416 |
| 2010/0065930 A1* | 3/2010 | Nakatani | B81C 1/00476 257/415 |
| 2011/0075865 A1 | 3/2011 | Yang et al. | |
| 2012/0248555 A1 | 10/2012 | Wang et al. | |

FOREIGN PATENT DOCUMENTS

| | | |
|---|---|---|
| TW | 200927634 | 7/2009 |
| TW | M360536 U | 7/2009 |
| TW | 200936491 | 9/2009 |
| TW | 201010938 | 3/2010 |
| TW | 201012738 | 4/2010 |
| TW | 201036910 | 10/2010 |
| TW | 201113215 | 4/2011 |
| TW | 201113979 | 4/2011 |
| TW | I340485 | 4/2011 |
| TW | 201123567 | 7/2011 |
| TW | 201127738 | 8/2011 |

OTHER PUBLICATIONS

Huang et al., "Implementation of the CMOS MEMS Condenser Microphone with Corrugated Metal Diaphram and silicon Back-Plate", Sensors, 2011, pp. 6257-6269, vol. 11.

Weigold et al., "A MEMS Condenser Microphonoe for Consumer Applications", MEMS, Jan. 22-26, 2006, pp. 86-89.

Leinebach et al., "A New Capacitive Type MEMS Microphone", IEEE, 2010, pp. 659-662.

Kasai et al., "Novel Concept for a MEMS Microphone With Dual Channels for an Ultrawide Dynamic Range", MEMS, Jan. 23-27, 2011, 605-608.

* cited by examiner

PRESSURE SENSOR AND MANUFACTURING METHOD OF THE SAME

TECHNICAL FIELD

This disclosure generally relates to a pressure sensor, and a manufacturing method thereof.

BACKGROUND

In recent years, the smartphones and tablet PCs are used in various types. The functional requirement of smartphone for the anti-noise improvement is increasing. The technology of micro-electromechanical (MEMS) microphone is also developing increasingly. The market for MEMS microphones also grows increasingly.

MEMS microphones can be applied in a voice secretary, voice navigation and voice noise, etc., but the background noise of microphone may affect the quality of the communication. Therefore, in order to reduce background noise and thus can improve communication quality, the noise suppression technology of MEMS microphone is one of the important topics.

SUMMARY

In an embodiment, a pressure sensor is provided. The pressure sensor comprises a substrate, a dielectric oxide layer, a first electrode, a dielectric connection layer, and a second electrode. The dielectric oxide layer disposed on the substrate. The first electrode disposed on the dielectric oxide layer. The dielectric connection layer disposed on the first electrode. The second electrode disposed on the dielectric connection layer. The second electrode further comprises a patterned conductive layer having a plurality of holes, and a dielectric layer disposed on the pattered conductive layer and covered the inner side walls of the plurality of holes, and wherein a first chamber is between the first electrode and the second electrode and defined by the first electrode, the dielectric connection layer, and the second electrode.

Another embodiment introduces a manufacturing method of a pressure sensor. The method comprises providing a substrate, forming a first electrode on the substrate, forming a dielectric connection layer on the first electrode, and forming a second electrode on the dielectric connection layer. The manufacturing method of second electrode further comprises forming a patterned conductive layer on the second electrode and the patterned conductive layer has a plurality of holes, forming a dielectric layer on the pattered conductive layer and covering the inner side walls of the plurality of holes wherein a first chamber is between the first electrode and the second electrode and defined by the first electrode, the dielectric connection layer, and the second electrode.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 4A to FIG. 4J is a manufacturing method of a pressure sensor according to an embodiment of the disclosure.

FIG. 5A to FIG. 5D is a manufacturing method of a pressure sensor according to another embodiment of the disclosure.

DESCRIPTION OF EMBODIMENTS

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

Figure 1:
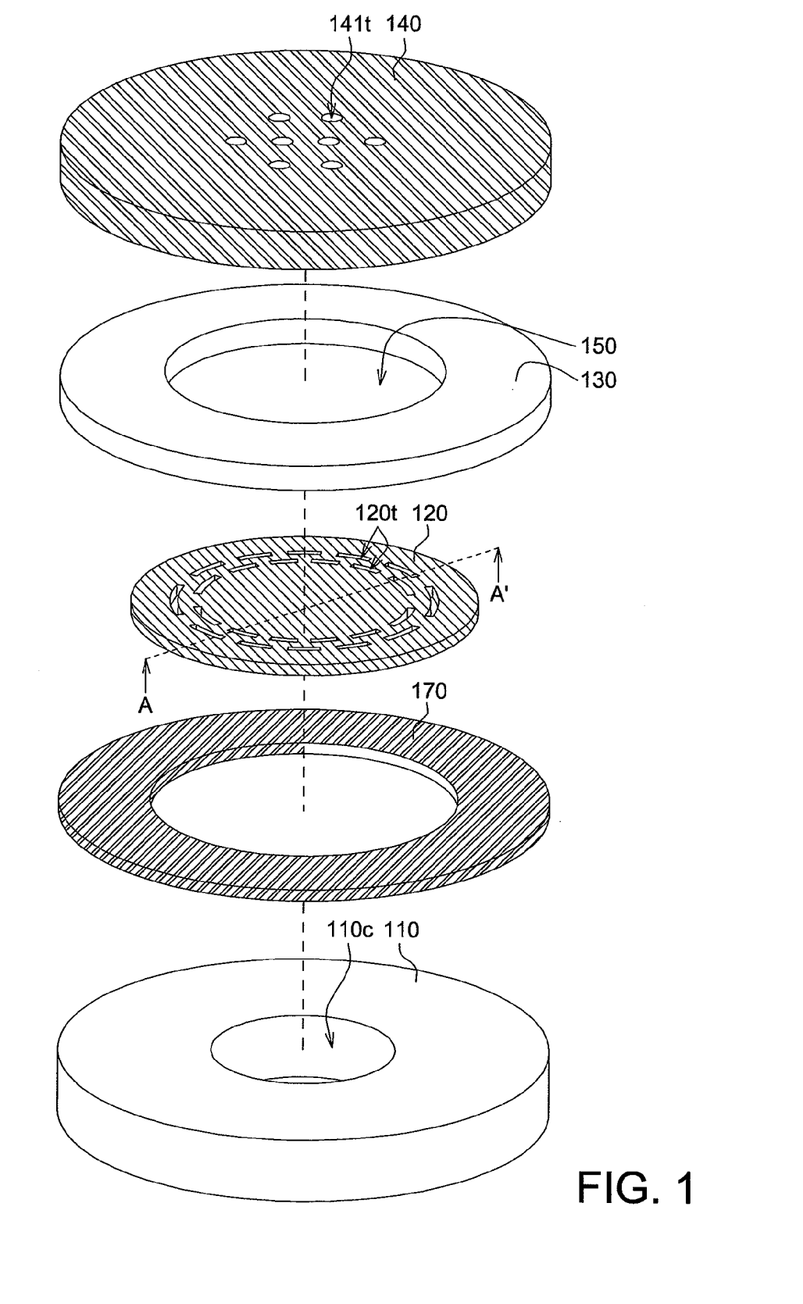
FIG. 1 is an explosion schematic view of a pressure sensor according to an embodiment of the disclosure.
Figure 2:
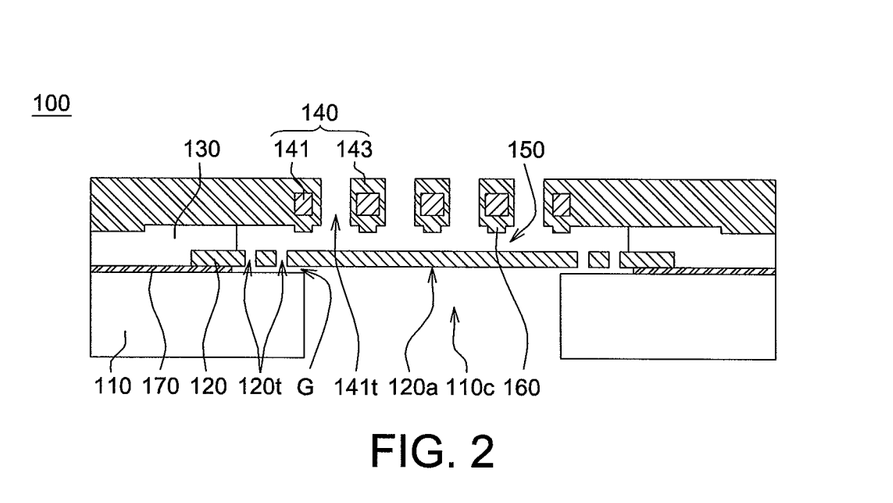
FIG. 2 is a cross-section of the pressure sensor along A~A' according to the embodiment of FIG. 1.

FIG. 1 is an explosion schematic view of a pressure sensor 100 according to an embodiment of the disclosure. FIG. 2 is a cross-section of the pressure sensor 100 along A~A' according to the embodiment of FIG. 1. Refer to FIG. 1 and FIG. 2, pressure sensor 100 comprises a substrate 110, a first electrode 120, a dielectric connection layer 130 and a second electrode 140. The first electrode 120 is disposed on the substrate 110. The dielectric connection layer 130 is disposed on the first electrode 120. The second electrode 140 is disposed on the dielectric connection layer 130. The second electrode 140 includes a patterned conductive layer 141 and a dielectric layer 143. The patterned conductive layer 141 has a plurality of holes 141t. The dielectric layer 143 is disposed on the patterned conductive layer 141 and covering the wall of these holes 141t. The first chamber 150 is between the first electrode 120 and the second electrode 140 and defined by the first electrode 120, the dielectric connection layer 130 and the second electrode 140.

As shown in FIG. 2, in one embodiment, the substrate 110 has a second chamber 110c. The second chamber 110c exposes the partial surface 120a of the first electrode 120. The material of the substrate 110 may be a silicon.

In one embodiment, the first electrode 120 has a plurality of slots 120t. The plurality of slots are connected to the first chamber 150 and the second chamber 110c. In this embodiment, as shown in FIG. 1, the surface 120a of the first electrode 120 may be circular. The plurality of slots 120t are arranged in a staggered arrangement around the area of the surface 120a.

In one embodiment, the pressure sensor 100, for example, sound pressure transducer, MEMS microphone. The first electrode 120 is a movable membrane with respect to the second electrode 140. The plurality of slots 120t of the first electrode 120 is designed to achieve reduction and release of the stress of material, thereby increasing the stress variation tolerance of the material during the manufacture process.

As shown in FIG. 2, the gap G is between the first electrode and the substrate, and the gap G is corresponding to the plurality of slots 120t of the first electrode 120. The second chamber 110c does not expose the plurality of slots 120t. In one embodiment, the sound pressure transducer is a pressure sensor 100, for example, the gap G is forming an acoustic resistance to improve the frequency response, and therefore the frequency response at low frequencies may reduce decay. The pressure sensor 100 sensing frequency more completely.

In one embodiment, the material of dielectric connection layer is not the same as a material of the first electrode 120 and a material of the second electrode 140. The dielectric connection layer 130 is connected to the first electrode 120 and the second electrode 140, therefore achieve the stress balance. Due to the different materials, the stress of dielectric layer and the stress of the first electrode 120 and the second electrode 140 may compensate each other in a process.

In one embodiment, the first electrode 120 may be polysilicon, and the dielectric connection layer 130 may be silicon oxide. The patterned conductive layer 141 of the second electrode 140 may be conductive metal, and the dielectric connection layer 130 may be silicon nitride (SiN). Since these aforementioned materials are the same be used in the CMOS process, and therefore the pressure sensor 100 can be applied in the production process the same as the CMOS process materials and processes, and then in part CMOS process after the completion of the addition of a MEMS process to complete pressure sensor produced 100. In one embodiment, the material of conductive/dielectric of the second electrode140 has a lower coefficient of thermal expansion (CTE) than the material of metals, thus it may improve the degree of material deformation caused by temperature change.

Furthermore, the second electrode 140, as shown in FIG. 2, the dielectric layer 143 is deposition on the patterned conductive layer 141, so that between the first electrode 120 and the patterned conductive layer 141 exists an air and the dielectric material. In one embodiment, the dielectric layer 143 may be a silicon nitride layer, for example, and has a dielectric constant about 7. The dielectric constant of the dielectric layer 143 is higher than the dielectric constant of the air (about 1), therefore the initial capacitance value of the dielectric layer 143 can be increased and may be reduced the parasitic capacitance affecting when the sensor is operating. The sensitivity of the sensor can be increasing.

In one embodiment, as shown in FIGS. 1 and 2, the plurality of holes 141$t$ on the patterned conductive layer 141 connect to first chamber 150. For example, the pressure sensor 100 is a sound pressure transducer, the plurality of holes 141$t$ can be served as a sound hole. However, the disclosure is not limited thereto. The number and distribution of plurality of holes 141$t$ may be appropriately adjusted for other applications.

In one embodiment, as shown in FIG. 2, the pressure sensor 100 may further comprises a dielectric oxide layer 170. The dielectric oxide layer 170 is disposed between the substrate 110 and the first electrode 120. The dielectric oxide layer 170 can define the location and size of the gap G.

As shown in FIG. 2, the pressure sensor 100 may further comprises a plurality of protrusions 160. The plurality of protrusions 160 is formed on the second electrode 140 and positioned between the first electrode 120 and the second electrode 140. As show in FIG. 1, the plurality of protrusions 160 (not shown) may be formed on the surface of the second electrode 140. As shown in FIG. 1, the plurality of protrusions 160 and the dielectric layer 143 is integrally formed.

The plurality of protrusions 160 may reduce the contact area between the upper and lower layer in processes (e.g., the first electrode 120 and the second electrode 140). For example, in wet-etching process, a first electrode 120 and the second electrode 140 may be sticking together. The adhesion of the first electrode 120 and the second electrode 140 can be reduced via the structure of protrusions 160. Therefore, the anti-stiction effect of the process can be achieved in the adjacent layers. In the pressure sensor 100, the two layers of two sides of the first chamber 150 (e.g., the first electrode 120 and the second electrode 140) may contact together when sound pressure is large or make a drop test. The plurality of protrusions 160 may reduce the contact area between the two layers of two sides of the first chamber 150, so that the two layers can easily return to its original position after contact, or could be able to overcome the van der Waals force or electrostatic force, thus the reliability of the sensor is improving.

Figure 3:
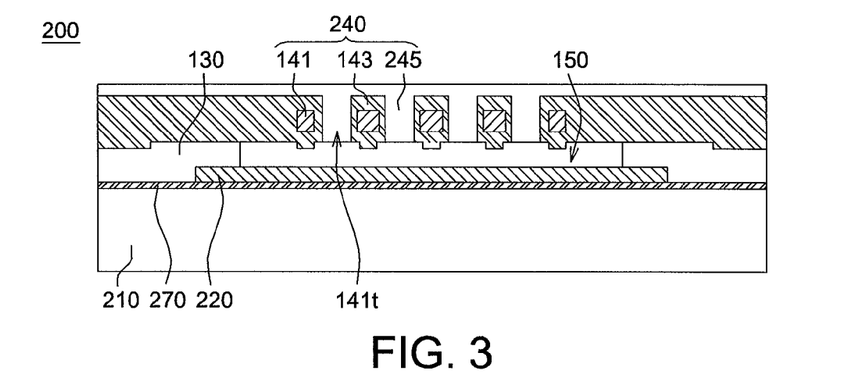
FIG. 3 is a schematic view of a pressure sensor according to another embodiment of the disclosure.

FIG. 3 is a schematic view of a pressure sensor according to another embodiment of the disclosure. The pressure sensor 200 of the embodiment is different from the pressure sensor 100 in a substrate 210, a first electrode 220, a second electrode 240, and a dielectric oxide layer 270, and the others as the same as pressure sensor 100 are not described.

As shown in FIG. 3, the substrate 210 does not have the second chamber, and a first electrode 220 does not have any slot. The first electrode 220, the dielectric connection layer 130 and the second electrode 240 is completely enclosed the first chamber 150'.

As shown in FIG. 3, the second electrode 240 further comprises a sealing material 245. The sealing material 245 is filled up the plurality of holes 141$t$ completely, so that the first electrode 220, the dielectric connection layer 130 and the second electrode 240 is completely enclosed the first chamber 150. In one embodiment, the sealing material 245 may be an insulating sealing material, for example an inorganic material, or an organic material, for example a silicon dioxide ($SiO_2$), silicon nitride (SiN) or parylene. In this embodiment, the pressure sensor 200 may be an absolute pressure sensor.

The following is another embodiment of the method for manufacturing a pressure sensor 100. With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion. Refer to FIG. 4A to FIG. 4J is a manufacturing method of a pressure sensor 100 according to an embodiment of the disclosure.

Figure 4A:
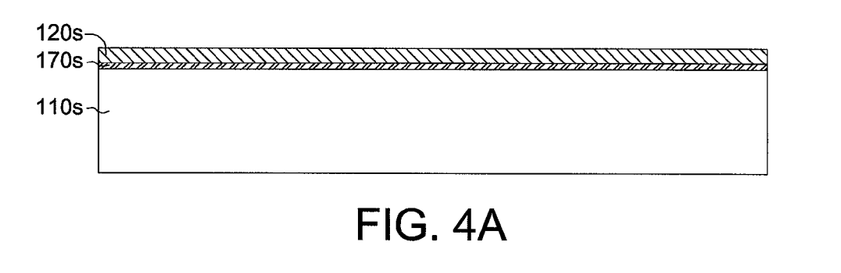
Figure 4B:
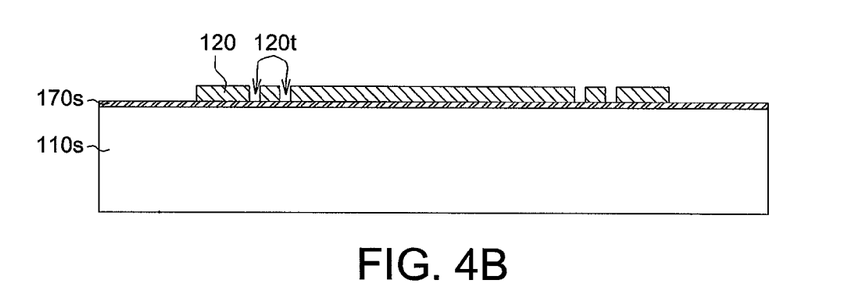

As show in FIG. 4A~FIG. 4B, providing a substrate 110$s$, and the first electrode 120 is formed on the substrate 110$s$. In this embodiment, a dielectric oxide layer 170$s$ is formed on the substrate 110$s$ before the first electrode 120 formed on the substrate 110$s$. The dielectric oxide layer 170$s$ is formed between the substrate 110$s$ and the first electrode 120.

As shown in FIG. 4A, the first electrode layer 120 is formed on the dielectric oxide layer 170$s$, then as shown in FIG. 4B, a plurality of slots 120$t$ are etched on the first electrode 120. The plurality of slots 120$t$ are for connect a first chamber 150 and a second chamber 110$c$ which are formed in the following process.

Next, as show in FIG. 4C~FIG. 4J, a dielectric connection layer 130 is formed on the first electrode 120, and a second electrode 140 is formed on the dielectric connection layer 130, wherein the first electrode 120, the dielectric connection layer 130 and the second electrode 140 defines a first chamber 150. The first chamber is between the first electrode 120 and the second electrode 140.

Figure 4C:
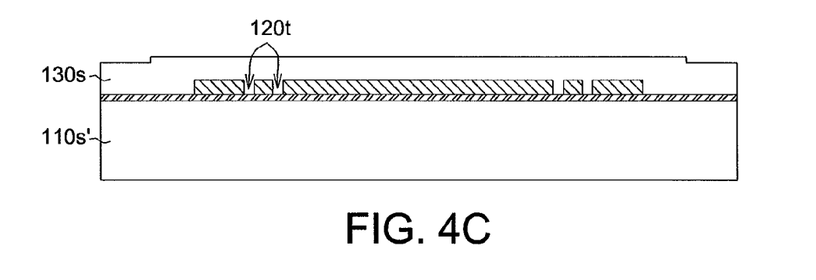

As shown in FIG. 4C, a dielectric connection layer 130$s$ is formed on the first electrode 120. In this step, the dielectric connection layer 130$s$ is filled up the plurality of slots 120$t$. In this embodiment, the substrate 110$s$ may be a thin process to form a thin substrate 110$s'$. The thin process is determined the thickness of the substrate 110 of the final product. Furthermore, the thickness can be determined the size of the first chamber 150. In this embodiment, the thin process may be grinding mode to form a thinned substrate.

Figure 4D:
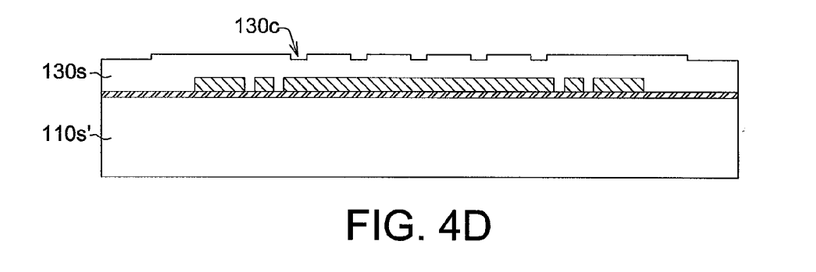

As shown in FIG. 4D, a plurality of recesses 130$c$ are etched and formed on the dielectric connection layer 130$s$. The plurality of recesses 130$c$ are defined the size and position of a plurality of protrusions in the following process.

Figure 4E:
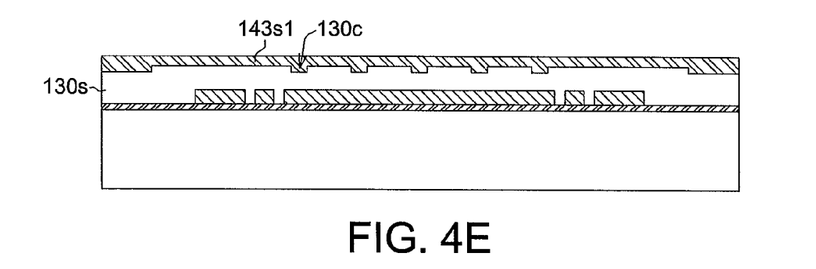

As shown in FIG. 4E, a first dielectric material layer 143$s$1 is formed on the dielectric connection layer 130$s$ and filled up the plurality of recesses 130$c$.

Figure 4F:
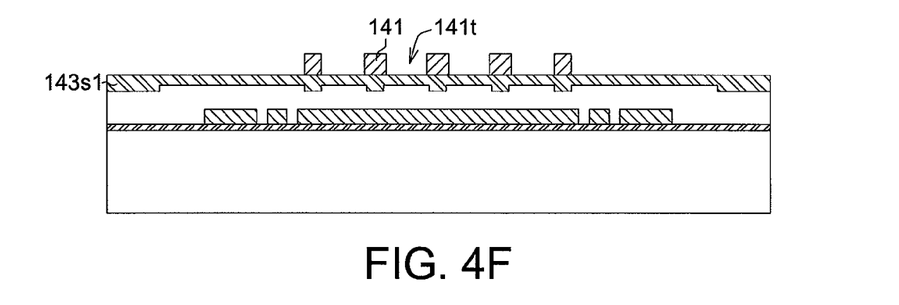

As shown in FIG. 4F, a patterned conductive layer 141 is formed on the first dielectric material layer 143s1. The patterned conductive layer 141 has a plurality of holes 141t. The plurality of holes 141t are formed by etching process.

Figure 4G:
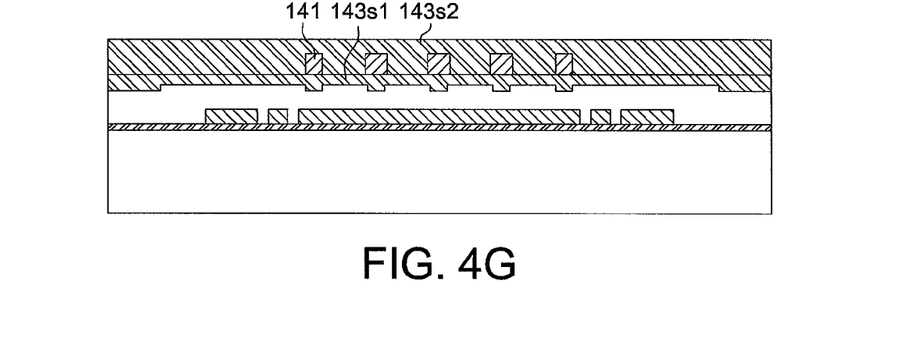

As shown in FIG. 4G, a second dielectric material layer 143s2 is formed on the patterned conductive layer 141 and fills up the plurality of holes 141t. The first and second dielectric material layer 143s1 and 143s2 are covered the patterned conductive layer 141. In this embodiment, the material of first and second dielectric material layer 143s1 and 143s2 may be the same material.

Figure 4H:
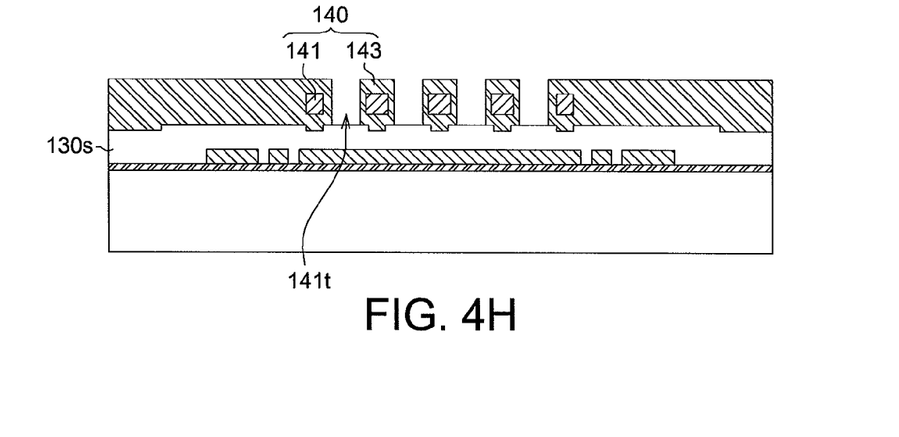

As shown in FIG. 4H, the first and second dielectric material layer 143s1 and 143s2 are formed a dielectric layer 143, a second electrode 140 is formed by etching the dielectric layer 143 (the first and second dielectric material layer 143s1 and 143s2) which are depended on the position of the plurality of holes 141t. In the step, the plurality of holes 141t is etching to expose the dielectric connection layer 130s. The dielectric layer 143 is covering the inner side walls of the plurality of holes 141t in the second electrode 140.

Figure 4I:
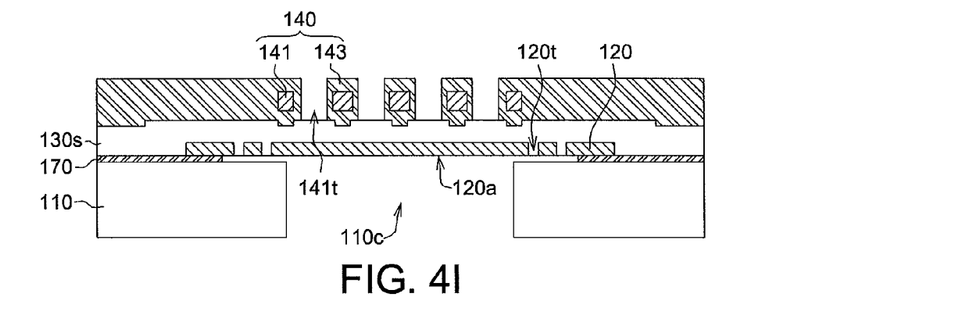

As shown in FIG. 4I, a second chamber 110c is formed by etching the substrate 110s. The second chamber 110c exposes a partial surface 120a of the first electrode 120. In this embodiment, the dielectric oxide layer 170s may be as an etch barrier layer when the substrate110s is etching. A second chamber 110c is formed by etching the substrate 110. In this embodiment, the process could be further etching the dielectric oxide layer 170s and then a gap G could be formed between the first electrode 120 and the substrate 110. The process may be a wet etching process.

Figure 4J:
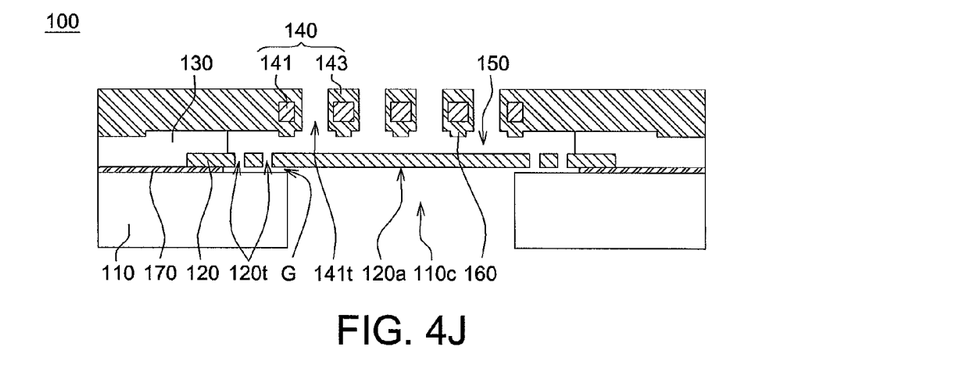

As shown in FIG. 4J, the first chamber 150, a dielectric connection layer 130 and the plurality of protrusions 160 are formed by etching the dielectric layer 143. In this embodiment, a wet etching process is performed. Thus, the pressure sensor 100 is formed as shown in FIG. 4J (FIG. 1).

The following is another embodiment of the method for manufacturing a pressure sensor 200. With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion. Refer to FIG. 4C to FIG. 4H and FIG. 5A to FIG. 5D. As show in FIG. 5A to FIG. 5D is a manufacturing method of a pressure sensor 200 according to another embodiment of the disclosure.

Figure 5A:
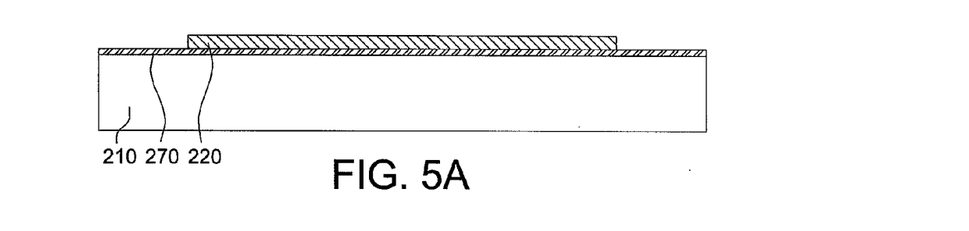
Figure 5B:
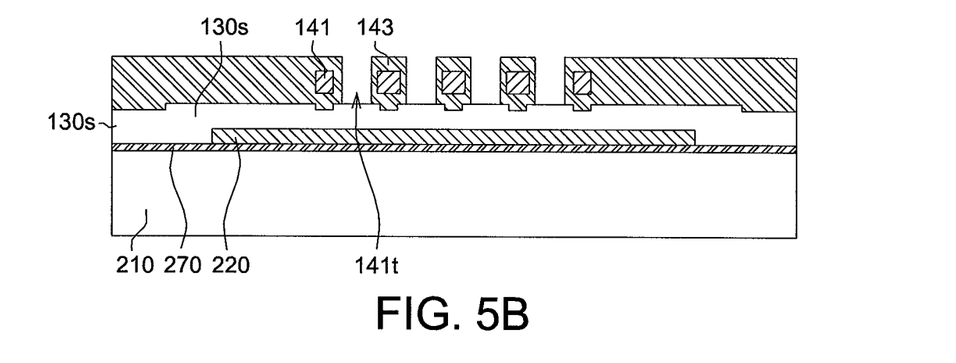

As show in FIG. 5A, providing a substrate 210. A dielectric oxide layer 270 is formed on the substrate 210, and a first electrode 220 is formed on the substrate 210.

As show in FIG. 4C~FIG. 4H and FIG. 5B, a patterned conductive layer 141, a dielectric layer 143 and the plurality of holes 141t are formed as the same as the FIG. 4C~FIG. 4H. The plurality of holes 141t extend to contact with the dielectric connection layer 130s.

Figure 5C:
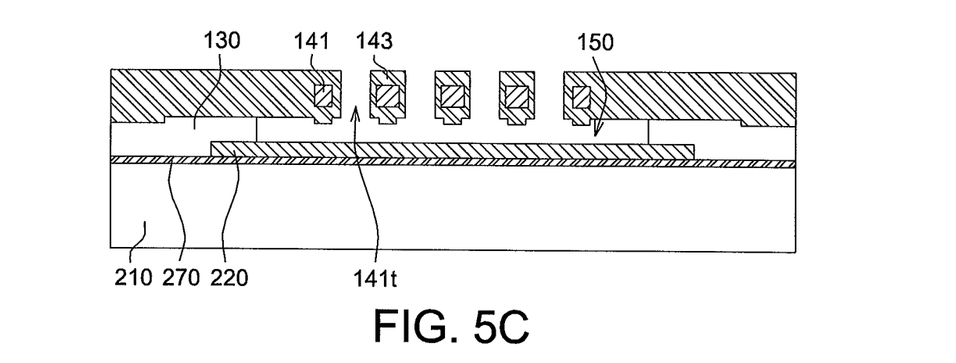

As show in FIG. 5C, a dielectric connection layer 130 and a first chamber 150 are formed by etching the dielectric connection layer 130s. In this embodiment, the first chamber 150 is defined by the first electrode 220, the dielectric connection layer 130, the patterned conductive layer 141 and the dielectric layer 143. The first chamber 150 is between the first electrode 220 and the patterned conductive layer 141.

Figure 5D:
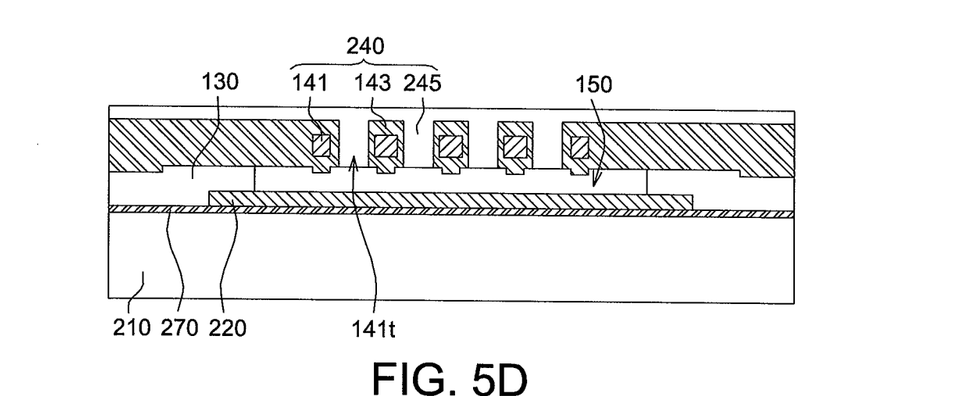

As show in FIG. 5D, filling a sealing material 245 into all of the plurality of holes 141t to seal all of the plurality of holes 141t, so that the first chamber 150 is completely enclosed by the first electrode 220, the dielectric connection layer 130 and the second electrode 240. Thus, the pressure sensor 200 is formed as shown in FIG. 5D (FIG. 3).

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pressure sensor, comprising:
a substrate;
a dielectric oxide layer disposed on the substrate;
a first electrode disposed on the dielectric oxide layer;
a dielectric connection layer disposed on the first electrode; and
a second electrode disposed on the dielectric connection layer,
the second electrode comprising:
a patterned conductive layer having a plurality of holes; and
a dielectric layer disposed on the patterned conductive layer and covered inner side walls of the plurality of holes,
wherein a first chamber is between the first electrode and the second electrode and defined by the first electrode, the dielectric connection layer, and the second electrode,
wherein an outer region of the first electrode is interposed between the dielectric connection layer and the dielectric oxide layer,
wherein the first electrode contacts the dielectric connection layer and the dielectric oxide layer, and
wherein the dielectric connection layer is connected to the first electrode and the second electrode.

2. The pressure sensor of claim 1, wherein the substrate further comprising a second chamber to expose a partial surface of the first electrode.

3. The pressure sensor of claim 2, wherein the first electrode has a plurality of slots to connect the first chamber and the second chamber.

4. The pressure sensor of claim 3, wherein the first electrode and the substrate is separated by a gap.

5. The pressure sensor of claim 1, wherein a material of the dielectric connected layer is different from a material of the first electrode and a material of the second electrode.

6. The pressure sensor of claim 1, wherein the plurality of holes connect to the first chamber.

7. The pressure sensor of claim 1, further comprising a plurality of protrusions disposed on the second electrode and the plurality of protrusions disposed between the first electrode and the second electrode.

8. The pressure sensor of claim 1, wherein the second electrode further comprising a sealing material filled up the plurality of the holes to close the first chamber wherein the first chamber is enclosed between the first electrode, the dielectric connection layer and the second electrode.

9. A method of manufacturing a pressure sensor, comprising:
providing a substrate;
forming a dielectric oxide layer on the substrate;
forming a first electrode on the dielectric oxide layer;
forming a dielectric connection layer on the first electrode; and
forming a second electrode on the dielectric connection layer, further comprising:
forming a patterned conductive layer having a plurality of holes; and forming a dielectric layer on the patterned conductive layer and covering inner side walls of the plurality of holes, wherein a first chamber is between the first electrode and the second electrode and defined by the first electrode, the dielectric connection layer, and the second electrode, wherein an outer region of the first electrode is interposed between the dielectric connection layer and the dielectric oxide layer, wherein the first electrode contacts the dielectric connection layer and the dielectric oxide layer, and wherein the dielectric connection layer is connected to the first electrode and the second electrode.

10. The method of manufacturing the pressure sensor as claim in claim 9, further comprising etching the substrate to form a second chamber, and exposing a partial surface of the first electrode.

11. The method of manufacturing the pressure sensor as claim in claim 10, further comprising forming a plurality of slots in the first electrode to connect the first chamber and the second chamber.

12. The method of manufacturing the pressure sensor as claim in claim 9, further comprising forming a plurality of protrusions on the second electrode between the first electrode and second electrode.

13. The method of manufacturing the pressure sensor as claim in claim 9, further comprising forming a gap on the dielectric oxide layer between the substrate and the first electrode.

14. The method of manufacturing the pressure sensor as claim in claim 9, further comprising filling a sealing material in the plurality of the holes to close the first chamber wherein the first chamber is enclosed between the first electrode, the dielectric connection layer and the second electrode.

* * * * *